United States Patent

Mieno et al.

Patent Number: 5,298,458
Date of Patent: Mar. 29, 1994

[54] METHOD OF FORMING TUNGSTEN FILM

[75] Inventors: Fumitake Mieno; Yuji Furumura; Toshihiko Ono, all of Kawasaki, Japan

[73] Assignee: Fujitsu Limited, Kanagawa, Japan

[21] Appl. No.: 967,065

[22] Filed: Oct. 28, 1992

[30] Foreign Application Priority Data

Oct. 31, 1991 [JP] Japan .................................. 3-286202

[51] Int. Cl.$^5$ .............................................. H01L 21/00
[52] U.S. Cl. ..................................... 437/187; 437/245; 437/200
[58] Field of Search ................ 437/192, 245, 200, 187

[56] References Cited

U.S. PATENT DOCUMENTS

4,902,645  2/1990  Ohba ..................................... 437/187

OTHER PUBLICATIONS

N. Kobayashi, et al., "Study on Mechanism of Selective Chem. Vap. Deposition of Tungsten", J. Appl. Phys. 69 (1991) p. 1013.

H. Goto et al., Chemical Reaction and Film Characteristics of $SiH_2F_2$ Reduced W-CVD Compared with $SiH_4$ Reduction Process, Advanced Metallization for ULSI Applications, Japan Conference, pp. 37-38, Oct. 28-30, 1991.

*Primary Examiner*—Olik Chaudhuri
*Assistant Examiner*—C. Everhart
*Attorney, Agent, or Firm*—Armstrong, Westerman, Hattori, McLeland & Naughton

[57] ABSTRACT

A tungsten film is deposited on a substrate by a CVD process using a source gas comprising $WF_6$, a silane group compound such as $SiH_4$, $Si_2H_6$, $Si_3H_8$ or $Si_4H_{10}$, and hydrogen fluoride or fluorine, at a lower temperature than in the prior art. The resultant tungsten film has low sheet resistance and good step coverage. The tungsten film may be selectively deposited.

8 Claims, No Drawings

METHOD OF FORMING TUNGSTEN FILM

BACKGROUND OF THE INVENTION

1. Field of the Invention

The present invention relates to a method of forming a tungsten film, and particularly, to a method in which a tungsten film may be deposited at a lower temperature.

Although aluminum films are broadly used for interconnecting material in the semiconductor production industry, attention has recently been directed to tungsten films that are superior to the aluminum films in properties, such as electro-migration at higher temperatures. When tungsten films are used as an interconnecting material, a method of forming a tungsten film by a low temperature chemical vapor deposition process is required, in which grain size can be reduced to provide good step coverage and good surface morphology, and the resistance value can be reduced.

2. Description of the Related Art

In a prior method of forming a tungsten film, a film of tungsten is deposited onto the entire surface of a substrate by a chemical vapor deposition (CVD) process using a mixed gas of tungsten hexafluoride ($WF_6$) and hydrogen ($H_2$) as a source gas at a depositing temperature of 450° C. The chemical reaction in this case is as follows:

$$WF_6 + 3H_2 \rightleftharpoons W + 6HF$$

Although hydrogen may be replaced by silane such as $SiH_4$, the use of silane is rare.

In this prior method of forming a tungsten film, however, the deposition of tungsten at a lower temperature for reducing grain size and thereby improving step coverage and surface morphology results in the inclusion of impurities such as fluorine into the deposited film, and a reaction of fluorine with tungsten to form compounds such as WF and thereby increasing the resistance value of the film.

SUMMARY OF THE INVENTION

It is an object of the present invention to provide a method of forming a tungsten film that can control an increase of the film resistance value by controlling the inclusion of impurities in the tungsten film when the film is deposited at a low temperature.

According to the invention, there is provided a method of forming a tungsten film on a substrate by a chemical vapor deposition (CVD) process using a source gas, wherein a gaseous mixture comprising tungsten hexafluoride gas, a silane group compound gas, and hydrogen fluoride or fluorine gas is used as the source gas.

The silane group compound gas used in the invention is exemplified by a gas of $SiH_4$, $Si_2H_6$, $Si_3H_8$, or $Si_4H_{10}$. A mixture of these gases may be used.

Hydrogen fluoride gas used in the invention is also called anhydrous hydrofluoric acid, which essentially has no water content, which is responsible for the undesirable oxidation of a deposited film.

The tungsten film made by the method of the present invention may be deposited on an underlying film as a substrate of a material used in the production of semiconductor devices, such as a semiconductor (e.g., silicon of singlecrystal or polycrystal), a conductor (e.g., aluminum), or an insulating material (e.g., oxide such as silicon oxide, nitride such as silicon nitride, phosphorus-containing vitreous material such as PSG or BPSG). In the present invention, a tungsten film may be deposited on the whole surface of a substrate, or selectively deposited on the portion or portions of a substrate surface. In the case of selective deposition, a tungsten film is deposited on a conductor or semiconductor, and not on an insulating material. In general, the deposition of a tungsten film may be carried out at a temperature of 300° to 400° C. A temperature of less than 300° C., such as 280° C., may be used if a reduction of the deposition rate is acceptable. At a higher temperature, the deposition rate is increased and the sheet resistance of the deposited film is improved, but the step coverage of the film is reduced.

The tungsten film can generally be deposited on the whole surface of a substrate when the pressure is higher, and in the case of low pressure, the film be selectively deposited only on a conductor or semiconductor material. The pressure for the deposition on the whole surface of a substrate is generally 50 to 100 Torr. On the other hand, the tungsten film may be selectively deposited at a pressure of 0.01 to 1.0 Torr, preferably 0.05 to 0.1 Torr. The higher the pressure, the more the step coverage is improved.

When a tungsten film is selectively deposited, the molar ratio of silicon to fluorine in a reaction system may be 1:4 or more. Since efficiency of selective deposition increases with an increase in the amount of fluorine, the use of fluorine in a greater ratio than this ratio is preferable.

For an explanation of the principle of the invention, some reaction formulae and enthalpies of formation of inventive and comparative examples are shown in Table 1. In this table, the inventive examples are abbreviated as Inv., and the comparative examples as Comp. Comparative example 1 (Comp. 1) represents the deposition of a tungsten film on the whole surface of a substrate by a CVD using a mixture of $WF_6$ and $H_2$ as a source gas; comparative example 2 (Comp. 2) represents using a mixture of $WF_6$ and $SiH_4$ as a source gas, comparative example 3 (Comp. 3) represents using a mixture of $WF_6$ and $Si_2H_6$, and comparative example (Comp. 4) represents using a mixture of $WF_6$ and $SiH_2F_2$. On the other hand, inventive example 1 (Inv. 1) represents using a mixture of $WF_6$, $SiH_4$, and HF as a source gas, and inventive example 2 represents using a mixture of $WF_6$, $Si_2H_6$, and HF as a source gas.

TABLE 1

| Reaction formulae and enthalpies of formation for various source gases | |
|---|---|
| Reaction formulae | Enthalpy |
| Comp. 1  $WF_6 + 3H_2 = W + 6HF$ | −288 kJ/mol |
| Comp. 2  $WF_6 + 2SiH_4 = W + 2SiHF_3 + 3H_2$ | −3354 kJ/mol |
| Inv. 1   $WF_6 + 2SiH_4 + 2\underline{HF} =$ <br> $W + 2SiF_3 + 5H_2$ | −4376 kJ/mol |
| Comp. 3  $WF_6 + Si_2H_6 = W + 2SiHF_3 + 2H_2$ | −2966 kJ/mol |
| Inv. 2   $WF_6 + Si_2H_6 + 2\underline{HF} =$ <br> $W + 2SiF_4 + 3H_2$ | −3568 kJ/mol |
| Comp. 4  $WF_6 + 6SiH_2F_2 = W + 6SiHF_3 + 3H_2$ | −3354 kJ/mol |

As can be seen from Table 1, the enthalpy of formation in the comparative example 2 using $WF_6$ gas and $SiH_4$ gas as a source gas is −3354 kJ/mol and has a smaller absolute value, whereas the enthalpy of formation in the inventive example 1, which represents HF gas being further included in the source gas, is −4376 kJ/mol and can have a larger absolute value. Also, the enthalpy of formation in the comparative example 3 using WF$_6$ gas and Si$_2$H$_6$ gas as a source gas is $-2966$ kj/mol and has a smaller absolute value, whereas the enthalpy of formation in the inventive example 2, which represents HF gas being further included, is $-3568$ kj/mol and can have a larger absolute value than in the case of the comparative example 3. Moreover, the enthalpies of formation in the inventive examples 1 and 2 can have a larger absolute value than in the case of the comparative example 1 in which WF$_6$ gas and H$_2$ gas are used as a source gas and in the case of the comparative example 4 in which WF$_6$ gas and SiH$_2$F$_2$ gas are used as a source gas.

Thus, in the present invention, the absolute value of enthalpy of formation can be increased due to a source gas further containing HF gas, compared with the comparative examples 1 to 4 in which the source gas does not comprise HF gas. Accordingly, a reaction can be promoted in a more stable state, and the stable deposition of tungsten at a lower temperature providing good surface morphology can be realized in the present invention. In addition, since silicon may be consumed as a stable form of SiF$_4$ gas, which can easily be removed from the reaction system, the inclusion of silicon into the deposited film can be controlled and an increase in the resistance of the film can be controlled.

Although the above explanation relates to the deposition on the whole surface of a substrate, the invention, of course, is not limited thereto, and may be applied to the selective deposition of a tungsten film. In the selective deposition, the amount of fluorine is increased discretionally, and the deposition is performed at a lower pressure, as described before.

DESCRIPTION OF THE PREFERRED EMBODIMENTS

The invention is further explained in the following examples. These examples are provided only to illustrate the invention, and are not to be construed as limitations thereof.

COMPARATIVE EXAMPLES 1 and 2

According to the known method, a tungsten film was deposited on the whole surface of a TiN film by a CVD process, using a mixed gas of WF$_6$ and H$_2$ as a source gas. For each example, the film deposition was carried out under the conditions summarized in Table 2. The observed deposition rates, sheet resistances, step coverages, and degrees of reflection of the deposited tungsten film are also shown in Table 2. The degree of reflection is shown as the percentage relative to the degree of reflection of 480 nanometer light on an aluminum film. The sheet resistance was measured for a film of 2000 angstroms.

TABLE 2

| Comp. Ex. | Temp. °C. | Press. Torr | WF$_6$ sccm* | H$_2$ sccm* | Deposition Rate ang./min | Sheet Resistance microohm /square | Coverage % | Deg. of Reflection % |
|---|---|---|---|---|---|---|---|---|
| 1 | 445 | 80 | 18 | 1 | 4000 | 17 | 40-50 | 50-55 |
| 2 | 415 | 80 | 50 | 400 | 3600 | 25 | 100 | 25 |

*sccm = standard cubic centimeters per minute

As can be seen from the Table, lowering the deposition temperature results in an increase in sheet resistance.

EXAMPLE 1

Using a mixed gas of WF$_6$, SiH$_4$, and HF in the proportion indicated in Table 3, a tungsten film was deposited on the whole surface of a TiN film at 380° C. and 80 Torr. In this example, 1 liter per minute of argon was supplied as a carrier gas. Such a carrier gas is not always necessary, and may be omitted in the deposition at a lower pressure. The observed results are shown in Table 3.

TABLE 3

| Temp. °C. | Press. Torr | WF$_6$ sccm* | SiH$_4$ sccm* | HF sccm* | Deposition Rate ang./min | Sheet Resistance Microohm /square | Coverage % | Deg. of Reflection % |
|---|---|---|---|---|---|---|---|---|
| 380 | 80 | 18 | 10 | 20 | 4000 | 17 | 80 | 65 |

*sccm = standard cubic centimeters per minute

In this example, in spite of the substantial reduction of the deposition temperature, the same deposition rate as the comparative example 1 was attained. The attained sheet resistance was also the same as that of the comparative example 1, with the step coverage much improved, and the degree of reflection being comparable.

EXAMPLE 2

This example illustrates a selective deposition of a tungsten film.

A tungsten film was deposited on a silicon wafer by a CVD process. The surface of the silicon wafer to which the tungsten film was deposited had a strip pattern of silicon dioxide (SiO$_2$) formed by a chemical vapor deposition and subsequent etching.

In the CVD process for the tungsten film, WF$_6$, SiH$_4$, and HF gases were supplied at flow rates of 5, 3, and 12 standard cubic centimeters per minute (sccm), respectively, at a temperature of 280° C. and a pressure of 50 mTorr, while hydrogen gas was supplied at a rate of 100 sccm as a carrier gas.

The rate of deposition of a tungsten film of 1,200 angstroms per minute was observed, and a selectivity of up to 10,000 angstroms was shown, i.e., the deposition of tungsten on the top surfaces of the SiO$_2$ strips was not observed until the tungsten film was deposited on the silicon surface with a thickness of up to 10,000 angstroms.

In contrast, when a tungsten film was deposited on a similar silicon wafer provided with a strip pattern of SiO$_2$ using the same conditions as described above, except that the supply of HF gas was omitted, (i.e., only WF$_6$ and SiH$_4$ were supplied as a source gas), the resultant deposition rate was 1,500 angstroms per minute, and the selectivity of 3,000 angstroms was observed. If the thickness of the tungsten film deposited on the exposed silicon surface exceeded 3,000 angstroms, stripes or spots of tungsten were formed on the strips of $SiO_2$.

It will be apparent from the foregoing that many other variations and modifications may be made without departing from the spirit and scope of the present invention. For example, a person with ordinary skill in the art could easily determine the optimum proportion of three ingredients of a source gas by experimentation, depending on the deposition conditions, such as temperature, pressure, and deposition rate.

We claim:

1. A method of forming a tungsten film on a substrate by a chemical vapor deposition (CVD) process using a source gas, wherein a gaseous mixture comprising tungsten hexafluoride gas, a gas whose molecules consist of silicon and hydrogen, and hydrogen fluoride or fluorine gas is used as the source gas.

2. The method of claim 1, wherein the gas whose molecules consist of silicon and hydrogen is selected from the group consisting of $SiH_4$, $Si_2H_6$, $Si_3H_8$, $Si_4H_{10}$, or mixtures thereof.

3. The method of claim 1, wherein the tungsten film is deposited on the whole surface of the substrate.

4. The method of claim 1, wherein the tungsten film is deposited on the portion or portions of the surface of the substrate.

5. The method of claim 1, wherein the tungsten film is deposited at a temperature of 300° to 400° C.

6. The method of claim 3, wherein the tungsten film is deposited at a pressure of 50 to 100 Torr.

7. The method of claim 4, wherein the tungsten film is deposited at a pressure of 0.01 to 1.0 Torr.

8. The method of claim 4, wherein the molar ratio of silicon to fluorine in the source gas is 1:4 or more.

* * * * *